United States Patent [19]

Wroe et al.

[11] Patent Number: 4,994,903
[45] Date of Patent: Feb. 19, 1991

[54] CIRCUIT SUBSTRATE AND CIRCUIT USING THE SUBSTRATE

[75] Inventors: Thomas Wroe, Dennis; Henry F. Breit, Attleboro, both of Mass.

[73] Assignee: Texas Instruments Incorporated, Dallas, Tex.

[21] Appl. No.: 452,183

[22] Filed: Dec. 18, 1989

[51] Int. Cl.⁵ .................... H01L 23/02; H01L 39/02; H01L 23/12; H01L 23/48
[52] U.S. Cl. ........................................ 357/81; 357/80; 357/74; 357/65
[58] Field of Search ........................... 357/81, 80, 74; 361/386; 428/209, 567, 594

[56] References Cited

U.S. PATENT DOCUMENTS

| | | | |
|---|---|---|---|
| 3,097,329 | 7/1963 | Siemens | 317/234 |
| 3,220,107 | 3/1961 | Clark | 29/474.1 |
| 3,399,332 | 8/1968 | Savolainen | 317/234 |
| 4,158,719 | 6/1979 | Frantz | 428/567 |
| 4,283,464 | 8/1981 | Hascoe | 428/594 |
| 4,370,421 | 1/1983 | Matsushita et al. | 501/88 |
| 4,401,728 | 8/1983 | Larker | 428/614 |
| 4,472,762 | 9/1984 | Spinelli et al. | 361/386 |
| 4,521,801 | 6/1985 | Kato et al. | 357/71 |
| 4,680,618 | 7/1987 | Kuroda et al. | 357/74 |
| 4,788,627 | 11/1988 | Ehlert et al. | 361/386 |
| 4,810,563 | 3/1989 | DeGree et al. | 428/209 |

Primary Examiner—Rolf Hille
Assistant Examiner—D. M. Ostronski
Attorney, Agent, or Firm—James P. McAndrews; John A. Haug; Melvin Sharp

[57] ABSTRACT

A circuit having a semiconductor device therein has a novel and improved circuit substrate comprising a layer of organic electrically insulating material having a layer of metal of relatively high electrical conductivity adhered to and supported on one side of the organic material layer forming electrically conductive circuit paths and forming a pad mounting the semiconductor device. A heat sink metal layer is adhered to and supported on an opposite side of the organic material layer for withdrawing heat from the semiconductor device. A multiplicity of particles of materials of relatively higher thermal conductivity than the organic layer material is dispersed in the organic material for enhancing heat withdrawal from the semiconductor device, and the heat-sink metal layer comprises a layer of a first metal of relatively low coefficient of thermal expansion having a plurality of apertures in therethrough and a second metal of relatively much higher thermal conductivity which is disposed in the apertures and on the opposite sides of the low expansion layer and which is metallurgically bonded to the low expansion layer material. The first and second metals in the heat-sink layer provide the heat-sink layer with heat-transferring properties and with an effective coefficient of thermal expansion which cooperates with the particles enhancing heat withdrawal from the semiconductor device for conducting withdrawn heat through the heat-sink layer to be rapidly dissipated while also providing improved reliability in the mounting and interconnection of the semiconductor device and the circuit during such enhanced heat withdrawal from the circuit.

4 Claims, 1 Drawing Sheet

CIRCUIT SUBSTRATE AND CIRCUIT USING THE SUBSTRATE

BACKGROUND OF THE INVENTION

The field of this invention is that of electronic circuits and relates more particularly to an improved circuit board substrate and a circuit using that substrate.

Conventional electronic circuit boards are concerned with mounting silicon semiconductor devices and the like in a compact and efficient manner on printed circuit pads and pads formed on a circuit board substrate and in withdrawing heat generated during the circuit operation to improve the operating characteristics and service lives of circuit components and the reliability of component mounting and interconnection in the circuit. Such circuit boards or substrates typically include an electrically insulating layer of organic material or the like which supports a thin sheet of electrically conductive metal on one side of the insulating layer to form the circuit paths and device mounting pads on the substrate. The substrates frequently include a heat-sink layer supported in electrically insulated relation to the circuit paths and device components on an opposite side of the electrically insulating layer for withdrawing heat from the circuit and from the circuit components during circuit operation. In such conventional circuit arrangements, there is usually a substantial mismatch in coefficient of thermal expansion between the silicon semiconductor devices and the like, the circuit paths and mounting pads in the substrate, and the heat-sink layer in the substrate but the thicknesses of the substrate layers and the amount of heat generated in the circuit are such that suitable circuit operation is achieved. In addition, the electrically insulating layer in the substrate to some extent retards heat-withdrawal from the circuit and circuit components into the heat-sink layer so that the thermal expansion mismatch of the heat-sink layer is not fully effective to warp or distort the substrate so as to interfere with reliable device mounting and interconnection. However, it is now proposed to substantially increase the heat-transfer properties of the electrically insulating substrate layers for permitting substantially increased circuit component mounting densities and the like resulting in increased-generation by the circuit so that thermal coefficient of expansion mismatch between the substrate layers create difficulties in circuit operation.

BRIEF SUMMARY OF THE INVENTION

It is an object of the invention to provide a novel and improved circuit board substrate and a novel and improved circuit using the substrate; and to provide such an improved circuit and substrate having improved capacity to draw heat from the circuit and components of the circuit while also displaying increased reliability of component mounting and interconnection in the circuit; and to provide such a substrate having the ability to provide such heat withdrawal properties at very low cost.

Briefly described, the novel and improved circuit substrate of the invention comprises a layer of organic electrically insulating material such as an epoxy or a polyimide or the like having a thin layer of metal such as copper or the like adhered to and supported on one side of the organic material layer. A heat-sink metal layer is adhered to and supported to an opposite side of the electrically insulating layer. A multiplicity of particles of material such as aluminum oxide or the like of relatively higher thermal conductivity than the organic material of the electrically insulating layer is dispersed in the organic layer material for significantly improving the heat-transfer properties of the electrically insulating layer of the substrate. The heat-sink layer comprises a layer of a metal such as invar or the like having a relatively low coefficient of thermal expansion and has a plurality of apertures in that low expansion layer extending between opposite sides of the low expansion layer. A second metal such as copper or aluminum or the like is disposed in the apertures in the low expansion metal layer to substantially fill the apertures and is also disposed on opposite sides of the low expansion layer, the second metal material being metallurgically bonded to the low expansion layer material so that the low expansion metal restrains thermal expansion of the heat-sink layer to provide the heat-sink layer with an effective thermal expansion coefficient preferably in the range of substantially matching the expansion coefficient of selected silicon semiconductor devices or the like. In that arrangement, the thin high conductivity metal layer material is selectively etched in conventional manner for forming electrically conductive circuit paths and semiconductor device mounting pads and the like. Silicon semiconductor devices and other components and the like are mounted on the substrate pads or the like and electrically connected in the circuit in conventional manner. The organic electrically insulating layer material has a thickness selected for providing the circuit and circuit components with electrical isolation from each other and from the heat-sink layer a may be desired while the particles dispersed in the insulating layer substantially enhance heat-transfer from the circuit through the electrically insulating layer to the heat-sink layer of the substrate. The heat-sink layer of the substrate as above described cooperates with such improved heat-transfer through the electrically insulating layer to transfer that increased withdrawn heat through the heat-sink layer, particularly via the high thermal conductivity metal in the noted apertures, while assuring that, although the heat-sink layer receives increased transfer of heat, the effective thermal expansion of the heat-sink layer in response to such increased heat-transfer is substantially limited for providing improved reliability of semiconductor device mounting and interconnection and the like in the circuit.

DESCRIPTION OF THE DRAWINGS

Other objects, advantages and details of the novel and improved circuit and circuit substrate of the invention appear in the following detailed description of preferred embodiments of the invention, the detailed description referring to the drawings in which.

Figure 1:
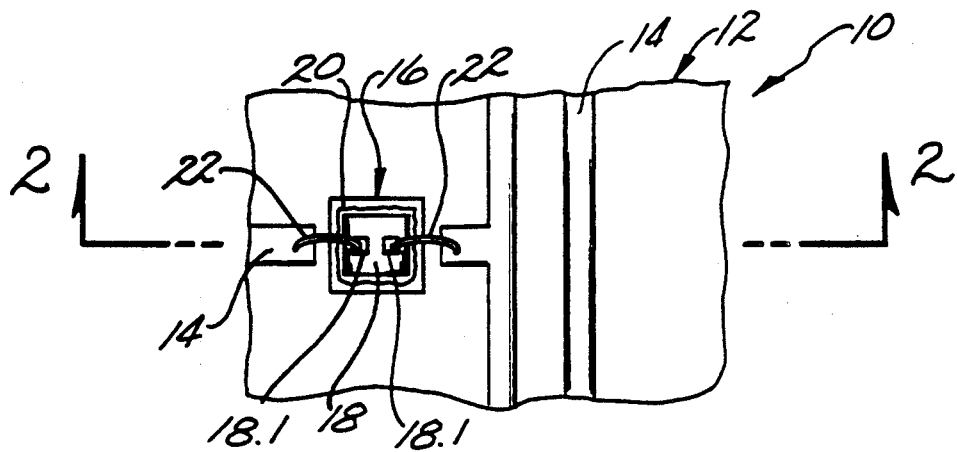
FIG. 1 is a partial plan view of an electronic circuit according to the invention.
Figure 2:
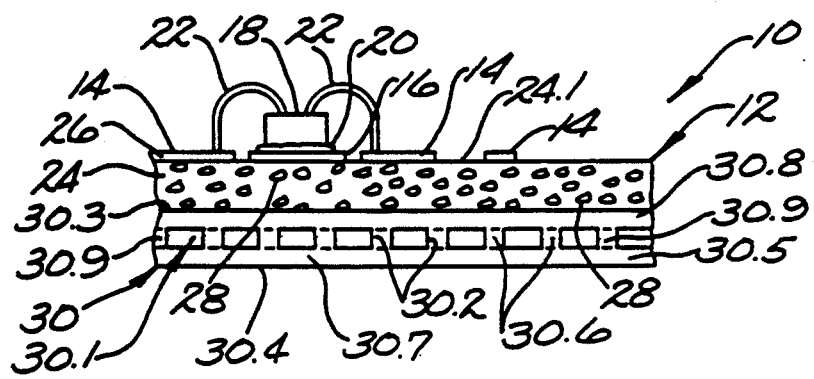
FIG. 2 is a section view to enlarge scale along line 2—2 of FIG. 1.

Referring to the drawings, 10 in FIGS. 1-2 indicates the novel and improved circuit of the invention which is shown to include the novel and improved substrate 12, selected electrically conductive circuit paths 14 formed in the substrate, maintain pads 16 formed in the substrate for mounting a silicon semiconductor device 18 or other component or the like such as an integrated circuit formed in a silicon semiconductive material, a silver solder, silver-filled epoxy or the like 20 for mounting the semiconductor device on a circuit mounting pad, and wire leads 22 or the like electrically connecting terminals 18.1 on the semiconductor device or other component to selected circuit paths or other components in the circuit 10 as will be understood. Typically the silicon semiconductor device has a relatively low thermal expansion coefficient.

In accordance with this invention, the circuit substrate 12 comprises a layer 24 of organic electrically insulating material of selected thickness, and has a thin layer 26 of a metal such as copper, aluminum or copper-clad aluminum or the like adhered and supported on one side 24.1 of the electrically insulating layer. The organic material of the electrically insulating layer has a multiplicity of particles dispersed therein as indicated at 28 in FIG. 2, those particles being formed of a material of relatively higher thermal conductivity than the organic material of electrically insulating layer for improving the heat-transfer properties of the electrically insulating layer. Preferably for example, the organic material of the electrically insulating layer 24 is selected from the group consisting of epoxies, acetal resins, polyimides, polyamides, polyimide-amides, polyesters, polyolefins, tetrafluorethylene, or acrylonitrile butadrene styrene (ABS) copolymers and the like and the particles 28 are formed of materials such as oxides, nitrides or carbides or the like of aluminum, boron, beryllium, magnesium, zinc, silicon, and titanian or the like. In a preferred embodiment for example, the organic material comprises an epoxy and the particles are formed of aluminum oxide. Preferably when the thickness of the electrically insulating layer is in the range from about 0.001 to 0.004 inches, the particles 28 have a particle size in the range from about 2 to 100 microns and constitute from about 2 to 65% by volume of the electrically insulating layer 24 for improving heat-transfer through the layer 24 by a factor of up to 7 or the like as compared to heat-transfer through a layer of the organic material alone of the same thickness.

The substrate 12 further includes a heat-sink layer 30 having a first metal layer 30.1 of a metal such as Invar (36% nickel, balance iron) having a relatively low coefficient of thermal expansion and having a plurality of apertures 30.2 spaced throughout the layer 30.1 extending between opposite sides 30.3, 30.4 of the low expansion layer. The heat-sink layer 30 further includes a second metal material 30.5 of a material such as copper or aluminum of relatively high thermal conductivity which is disposed in the apertures 30.2 in the low expansion layer as indicated at 30.6, preferably to fill the apertures, and which is also disposed along opposite sides of the low expansion layer as indicated at 30.7 and 30.8. Preferably the high thermal conductivity material is disposed on at least two edges of the heat-sink layer as indicated at 30.9. Preferably the metal of high thermal conductivity is metallurgically bonded to the metal of low expansion material and serves to restrain the thermal expansion of the heat-sink layer so that it has an effective thermal expansion coefficient in the range from about $3.5$ to $8.0 \times 10^{-7}$ in/in/oF. substantially corresponding to the materials embodies in silicon semiconductor devices or other device components or the like. Preferably for example, the material of the low expansion metal layer 30.1 is selected from the group consisting of alloys having a nominal composition by weight of from about 36 to 50 percent nickel and the balance iron, of about 31 percent nickel, 8 percent chromium, 8 percent cobalt and the balance iron, of about 32 percent nickel, 15 percent cobalt, 1 percent molybdenum and the balance iron, of about 38 percent nickel, 7 percent chromium and the balance iron, of about 17 percent chromium and the balance iron, of about 16.5 percent chromium, 4.5 percent aluminum, and the balance iron, of about 57 percent cobalt, 9 percent chromium and the balance iron, and of about 23 to 30 percent nickel, about 17 to 30 percent cobalt, about 0.6 to 0.8 percent manganese, and the balance iron. Preferably the second metal of relatively higher thermal conductivity in the heat-sink layer is selected from the group consisting of copper and aluminum and alloys thereof.

The circuit 10 is formed from the substrate 12 as above described in convention manner. That is, the circuit paths 14 are formed by selectively etching or otherwise removing metal of the substrate layer 26 using photoresists or the like in conventional manner. The semiconductor device 18 is mounted on the pad 16 by use of a solder 20 or the like, and the wire leads 22 are attached to device terminals 18.1 and to circuit paths 14 or the like by soldering or wire-bonding or the like in any conventional manner.

In that arrangement, the electrically insulating layer 24 electrically insulates sections of the circuit paths 14 from each other and electrically isolates circuit paths and components from the heat-sink layer 30. The electrically insulating layer is provided with a selected limited thickness for achieving the desired electrical isolation without excessively limiting heat-transfer through the electrically insulating layer. The particles 28 are dispersed in the electrically insulating layer for substantially enhancing heat withdrawal from the circuit 10, and particularly from the devices 18, and for rapidly transferring that heat through electrically insulating layer to the heat-sink layer 30. The high thermal conductivity metal 30.5 in the heat-sink layer is arranged to receive that increased heat withdrawn from the circuit to transfer it officially through the heat-sink layer particularly via the high thermal conductivity metal disposed in the apertures 30.2 in the noted low expansion layer of the heat-sink layer. This substrate achieves its improved heat-withdrawing properties at very low cost as compared with clad laminates of copper-molybdenum or the like. However, the effective thermal expansion coefficient of the heat-sink layer is restrained by the low expansion layer 30.1 therein so that the heat-sink layer is adapted to receive and rapidly dissipate heat generated in the circuit while also providing improved reliability in the mounting and interconnection of the silicon semiconductor devices in the circuit. That is, the heat-sink layer handles heat-dissipation to permit improved circuit density using the substrate 12 while also improving operating characteristics as interconnection reliability of the circuit.

It should be understood that although circuit 10 as thus described embodies only a single insulating layer 24, the invention is adapted to be modified as will be understood for providing multi layer circuit substrates and the like as may be desired. This invention includes all modifications and equivalents of the disclosed embodiments falling within the scope of the apended claims.

We claim:
1. A circuit substrate comprising a layer of organic electrically insulating material, a relatively high electrical conductivity metal layer adhered to and supported on one side of the organic electrically insulating material layer to be etched to form electrically conductive circuit paths and pads for mounting silicon semiconductor devices thereon, heat-sink metal layer means adhered to and supported on an opposite side of the organic electrically insulating material layer in electrically insulated relation to the relatively high electrical conductivity metal layer for withdrawing heat from said devices, the organic layer having a multiplicity of particles of material of relatively higher thermal conductivity than the organic layer material dispersed in the organic layer material for enhancing heat-withdrawal from the devices and the heat-sink metal layer means comprising a layer of metal of relatively low coefficient of thermal expansion with a plurality of apertures therein and a metal of a relatively higher thermal conductivity then said low expansion metal disposed in the apertures and defining thin metal layers of high thermal conductivity along each of two opposite sides of the layer of metal of relatively low coefficient of thermal expansion said metal of relatively higher thermal conductivity being metallurgically bonded to the layer of metal of relatively low coefficient of thermal expansion providing the heat-sink metal layer means with a selected heat-transfer properties and an effective coefficient of thermal expansion and having the organic layer adhered thereto along one side of the heat-sink metal layer means to cooperate with particles enhancing heat-withdrawal from the silicon semiconductor devices to conduct the withdrawn heat into and through the heat-sink metal layer means while also providing improved reliability of mounting of silicon semiconductor devices on said pads during the enhanced heat-withdrawal.

2. A circuit substrate according to claim 1, wherein the organic layer material is selected from the group consisting of epoxies, acetal resins, polyimides, polyamides, polyimide-amides, polyesters, polyolefins, tetrafluoroethylene and acrylonitule butadiene styrene copolymers, the particles are formed from materials selected from the group consisting of oxides, nitrides and carbides of aluminum, boron, beryllium, magnesium, zinc, silicon and titanium, the relatively high thermal conductivity metal and the heat sink layer is selected from the group consisting of copper and aluminum and alloys thereof, and the metal of relatively low coefficient of thermal expansion in the heat-sink layer is selected from the group consisting of alloys having a nominal composition by weight of from about 30 to 50 percent nickel and the balance iron, of about 31 percent nickel, 8 percent chromium, 8 percent cobalt and the balance iron, of about 32 percent nickel, 15 percent cobalt, 1 percent molybdenum and the balance iron, of about 38 percent nickel, 7 percent chromium and the balance iron, of of about 17 percent chromium and the balance iron, of about 16.5 percent chromium, 4.5 percent aluminum, and the balance iron, of about 57 percent cobalt, 9 percent chromium and the balance iron, and of about 23 to 30 percent nickel, about 17 to 30 percent cobalt, about 0.6 to 0.8 percent manganese, and the balance iron.

3. A circuit comprising a silicon semiconductor device; and a circuit substrate having a layer of organic electrically insulating material, a relatively high electrical conductivity metal layer adhered to and supported on one side of the organic electrically insulating material layer forming electrically conductive circuit paths and a pad for mounting the silicon semiconductor device, heat-sink metal layer means adhered to and supported on an opposite side of the organic electrically insulating material layer in electrically insulated relation to the circuit paths and silicon semiconductor device for withdrawing heat from the device, the organic layer having a multiplicity of particles of material of relatively higher thermal conductivity than the organic layer material dispersed in the organic layer material for enhancing heat-withdrawal from the device and the heat-sink metal layer means comprising a layer of metal of relatively low coefficient of thermal expansion with a plurality of apertures therein and a metal of relatively higher thermal conductivity than said low expansion metal disposed in the apertures and defining thin metal layers of high thermal conductivity along each of two opposite sides of the layer of metal of relatively low coefficient of thermal expansion, said metal of relatively higher thermal conductivity being metallurgically bonded to the layer of metal of relatively low coefficient of thermal expansion for providing the heat-sink metal layer means with selected heat-sink properties and an effective coefficient of thermal expansion and having the organic layer adhered thereto along one side of the heat sink metal layer means to cooperate with the particles enhancing heat-withdrawal from the semiconductor device to conduct the withdrawn heat into and through the heat-sink metal means while also providing improved reliability of mounting of the silicon semiconductor device on the pad during the enhanced heat-withdrawal.

4. A circuit according to claim 3 wherein the organic layer material in the substrate is selected from the group consisting of epoxies, acetal resins, polyimides, polyamides, polyimide-amides, polyesters, polyolefins, tetrafluoroethylene and acrylonitrile butaliene styrene copolymers, the particles in the substrate are formed from materials selected from the group consisting of oxides, nitrides and carbides, of aluminum, boron, beryllium, magnesium, zinc, silicon and titanium, the relatively high thermal conductivity metal in heat-sink layer of the substrate is selected from the group consisting of copper and aluminum and alloys thereof, and the metal of relatively low coefficient of thermal expansion in the heat sink layer of the substrate is selected from the group consisting of alloys having a nominal composition by weight of from about 36 to 50 percent nickel and the balance of iron, of about 31 percent nickel, 8 percent chromium, 8 percent cobalt and the balance iron, ob about 32 percent nickel, 15 percent cobalt, 1 percent molybdenum and the balance iron, of about 38 percent nickel, 7 percent chromium and the balance iron, of about 17 percent chromium and the balance iron, of about 16.5 percent chromium, 4.5 percent aluminum, and the balance iron, of about 57 percent cobalt, 9 percent chromium and the balance iron, and of about 23 to 30 percent nickel, about 17 to 30 percent cobalt, about 0.6 to 0.8 percent manganese and the balance iron.

* * * * *